United States Patent [19]
Togei et al.

[11] 4,062,037
[45] Dec. 6, 1977

[54] SEMICONDUCTOR MEMORY DEVICE

[75] Inventors: Ryoiku Togei; Akira Takei; Kunihiko Wada, all of Kawasaki, Japan

[73] Assignee: Fujitsu Limited, Japan

[21] Appl. No.: 677,130

[22] Filed: Apr. 15, 1976

[30] Foreign Application Priority Data

Apr. 18, 1975 Japan .................................. 50-46321

[51] Int. Cl.² ...................... H01L 29/78; H01L 27/10
[52] U.S. Cl. ...................................... 357/24; 357/23; 357/45
[58] Field of Search .............................. 357/23, 24, 45

[56] References Cited
U.S. PATENT DOCUMENTS

3,997,799  12/1976  Baker ........................ 357/24

Primary Examiner—Edward J. Wojciechowicz
Attorney, Agent, or Firm—Staas & Halsey

[57] ABSTRACT

A semiconductor memory device, which comprises: a P-type semiconductor material comprising on the surface thereof, an N-type doped layer, one surface region of the substrate adjoining the doped layer being used as a gate region, and further comprising in the interior thereof an N-type buried layer below another surface region of said substrate adjoining said one surface region. Electric charges representing information are stored in the buried layer. The reading time and the refreshing period are improved by shortening said reading time and lengthening said refreshing time utilization of said N-type buried layer.

22 Claims, 12 Drawing Figures

SEMICONDUCTOR MEMORY DEVICE

This invention relates to a semiconductor memory device, and, more particularly, to a semiconductor memory device employing a structure of a charge coupled device, hereinafter referred to as a CCD. Recently, attention has been concentrated upon employing CCD to a memory device.

In the general structure of CCD, for example, of a three-phase CCD, one gate electrode and a plurality of three electrodes for transferring electric charges are successively arranged on the top surface of an insulating material, which covers the semiconductor material substrate. In the general CCD device, the electric charge is successively transferred from one electrode to a neighbouring electrode and hence the time required for writing and reading a piece of information is proportional to the numbers of electrodes.

Persons including some of the Inventors previously proposed in a Patent Application claiming a priority on the Japanese Patent Application No. 43388/1975, a process for producing a random access CCD memory device, hereinafter referred to as a CCDRAM. This CCDRAM comprises a semiconductor material substrate having one particular conductivity type and comprising on the surface thereof a doped layer with an impurity of the opposite conductivity type, one surface region of said substrate adjoining said doped layer being used as a gate region, and another surface region of said substrate adjoining said one surface region being used as a memory cell region.

In the CCDRAM, an electric charge of said opposite conductivity type is either injected from the doped layer through the gate region into the memory cell region or withdrawn from the memory cell region through said gate region to said doped layer.

The memory device employing, for example, a P-type semiconductor substrate is operated as follows. The memory cell and an N-type doped layer are maintained at different, positive electric potentials in a normal state. The memory concept is based on the presumption that information "1" is represented by storing electrons in the memory cell.

Write

At the instant of writing information "1", a pulse voltage of zero value is applied to the doped layer. The gate electrode is then maintained at a positive electric potential. The voltage applied to the gate is lower than that of the memory cell. As a result of the applied voltages, the electric potential distribution is formed in the substrate such that the electric charge is transferred from the N-type doped layer to the memory cell through the gate region.

An information "0", is defined as the non-existence of an electric charge in the memory cell. The information "0" can be written by applying a positive pulse voltage to the gate while positive voltages of the memory cell and the doped layer are maintained.

Read

The electric potential of the memory cell drops to zero and is maintained at this state, while the positive pulse voltage is applied to the gate electrode. As a result of the applied voltages, the electric potential distribution is formed in the substrate such that the electric charge is withdrawn from the memory cell region to the N-type doped layer through the gate region. The electric potential of the N-type doped layer is lowered by an injection of the electric charge from the memory cell region to the doped layer. The voltage is lowered according to the quantity of the injected charge. The lowered electric potential is detected by a sensing amplifier connected to the lead, thereby reading the information which has been stored in the memory cell. Immediately after the detection of voltage being lowered, an electric potential of the N-type doped layer is set at zero value, and, subsequently, the electric potential of the memory cell is restored to a positive value, so that the electric charge is again injected into the memory cell region.

In a case where the information "0" is stored in the memory cell, the positive electric potential of the doped layer is unchangeably maintained, because no electric charge is injected into the doped layer. Since the memory cell remains positive in a normal state, the electric potential of the memory cell is restored, as stated above, to a positive value after the READ period. In this case, no electric charge is injected into the memory cell, because the potential of the N-type doped layer is unchangeably maintained.

Accordingly, it is possible to read the information of the memory cell without destroying the effectiveness of the memory cell.

Refresh

Since the memory cell has a positive electric potential during the storage of the information, minority carriers are generated in the memory cell with the result being that the "0" state is changed to the "1" state. Accordingly, the memory cell must be periodically, usually once every several tens of milliseconds, refreshed by means of dropping the potential of the memory cell electrode to zero. The refreshing is performed in the same manner as that in the reading of the information. Namely, the electric potential of the memory cell drops to zero, while the positive pulse voltage is applied to the gate electrode, thereby keeping the minority carriers, which cause dark current, away from the memory cell region. The electric charge stored in the memory cell region is injected into the doped layer. The injected charge is returned to the memory cell by the same methods as in the reading. Immediately after the detection of a change in voltage, an electric potential of the N-type doped layer is set at zero value, and, subsequently, the electric potential of the memory cell is restored to a positive value, so that the electric charge is again injected into the memory cell region. In a case where no change in voltage is detected, i.e., the information is "0", the electric potential of the memory cell is restored to a positive value after the same period as that of information "1". The positive electric potential of the doped layer is unchangeably maintained because no electric charge has been injected into the doped layer.

Accordingly, the minority carriers are definitely excluded from the memory cell region, while the previously stored electric charge is returned into the memory cell, and, furthermore, the electric charge previously not stored is not injected into the memory cell.

According to the previously proposed CCDRAM the electric charge is stored in an inversion layer near the surface of the substrate, wherein variances in the electric charges due to defects of the crystalline structure are abundant. It is, therefore, required to frequently refresh the memory cell. In addition, the electric charge is transferred within the region nearest the surface, wherein the transferring speed is believed to be approximately half of that in the interior.

Accordingly, it is the principal object of the invention to propose an improved CCDRAM, wherein the refreshing time is increased and the access time required for reading the information is decreased.

According to the object of the invention there is provided a semiconductor memory device which comprises:

a semiconductor material substrate having one particular conductivity type and comprising on the surface thereof, a doped layer with an impurity of the opposite conductivity type, one surface region of said substrate adjoining said doped layer being used as a gate region, and further comprising, in the interior thereof, a buried layer of said opposite conductivity type situated below another surface region, used as a memory cell region, of said substrate, and adjoining said one surface region being used as a gate region:

a first insulating layer placed on said substrate and provided with an aperture exposing a part of said doped layer;

a gate electrode placed over said gate region and electrically insulated from said gate region by at least one insulating layer;

a memory cell electrode placed over said memory cell region and electrically insulated from said memory cell region by at least one insulating layer, and;

a doped layer electrode electrically connected with said doped layer.

In the memory device, an electric charge of said opposite conductivity type is either injected from said doped layer through said gate region into said buried layer to be stored in this layer or withdrawn from said buried layer through said gate region to said doped layer, depending upon the electric potential levels in said substrate, said levels are established by an electric fields created by each of said electrodes through said insulating layers.

It is required to more heavily dope the impurity into the doped layer than into the buried layer, in order to allow the electric charge to be transferred from the doped layer into the buried layer. In addition to the heavy doping, it is advisable to heighten electric potential, or to deepen an electric potential well, in the buried layer more than that in the doped layer at the instant or WRITE; thereby, the electric charge can assuredly be injected into the doped layer. In addition, the relative voltages applied to the doped layer with regard to the gate electrode are required to be such that the electric charge can assuredly be transferred from the gate region to the doped layer at the instant of READ.

The invention is further described with regard to an embodiment thereof in conjunction with drawings in which.

Figure 1:
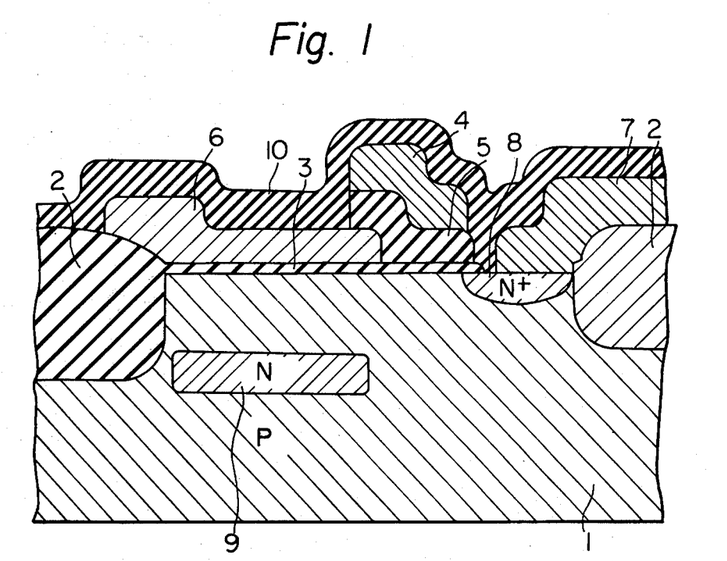
FIG. 1 is a somewhat schematic cross-sectional view taken along the passage of an electric charge of an embodiment of the memory device according to the present invention.

Referring to FIG. 1, the substrate 1 possesses a conductivity of a P-type and a concentration of impurity usually about $10^{15}$ or less atoms per cubic centimeter.

Hereinafter, the substrate 1 and all the other formed layers on it will be collectively referred to as a wafer.

It is obvious that all elements of the wafer can exhibit conductivity types opposite from those described in the specification. A $SiO_2$ layer 2 surrounds in a closed path a top portion of the substrate 1, on which one of the memory devices is formed, so as to electrically separate said memory device from other memory devices. An insulating layer 3 of $SiO_2$ is formed on the top portion of the substrate 1 and is provided with an aperture 12 through which a part of N+-type doped layer 8 is exposed. The memory cell electrode 6, which consists of, usually but not necessarily doped polycrystalline silicon, is placed on the $SiO_2$ layer 3 over the buried layer 9. The doped polycrystalline silicon layer 6 extends over the $SiO_2$ layer 2, because of an increase in the density of the device. A glass layer 5 containing a dopant is formed on a part of the surface of the polycrystalline silicon electrode 6 and substantially on the entire part of the $SiO_2$ layer 3, which is not covered by the electrode 6. Said one part of the electrode 6 is adjacent to the uncovered part of $SiO_2$ layer 3.

The gate electrode 4 is formed substantially on the entire surface of the glass layer 5. The gate electrode 4 consists of, usually but no necessarily, one of the components: aluminum, chromium, molybdenum, tungsten and doped polycrystalline silicon. A lead electrode 7 is made of one of said electrode components and is electrically connected with the N+-type doped layer 8. An insulating layer 10 covers the entire tope surface of the wafer to protect the underlying layers against ambient conditions.

Figure 2:
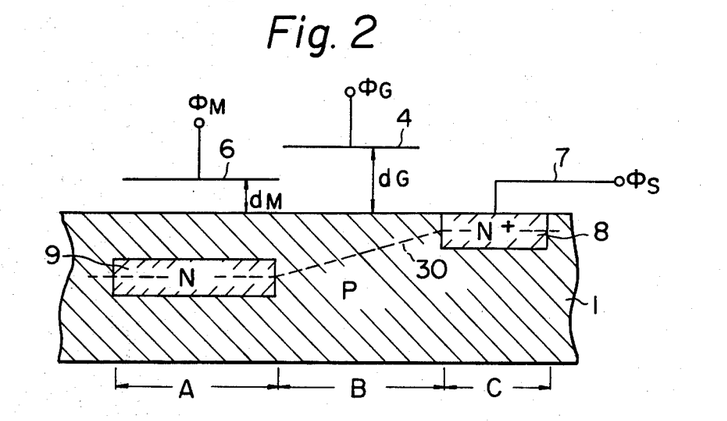
FIG. 2 is a schematic drawing of FIG. 1 depicting the minimum potential distribution.

In FIG. 2, the gate electrode 4 is electrically insulated from the underlying part of the substrate 1 by the insulating layers 3 and 5 (FIG. 1) having a thickness of dG while the memory cell electrode 6 is electrically insulated from the underlying part of the substrate 1 by the $SiO_2$ layer 3 (FIG. 1) having a thickness of dM. The voltages applied to the electrodes 4 and 6 by respective clock pulse means (not shown) are designated as $\phi_G$ and $\phi_M$ respectively. The N+-type doped layer 8 is electrically connected with the lead electrode 7 through which the voltage $\phi_S$ is applied by another clock pulse means (not shown). Appropriate voltages $\phi_G$, $\phi_M$ and $\phi_S$ applied to the electrodes 4, 6 and the doped layer 8, respectively, enable the electric charge to be transferred and stored as previously stated. Whenever voltage is not applied, the minimum electric potential is considered to distribute within the bulk of the substrate of the device as depicted by a dotted line 30, because the electric potential is minimum where the density of the impurity is maximum. The electric minimum potential line 30 in the gate region might possibly extend as shown in FIG. 2. Said line 30, therefore, extends both through the N+-type doped layer 8 and the N-type buried layer 9. The lateral sections of the bulk of the substrate, where the buried layer 9, the gate region and the N+-type doped layer 8 are included, are denoted as sections A, B and C, respectively.

Figure 3:
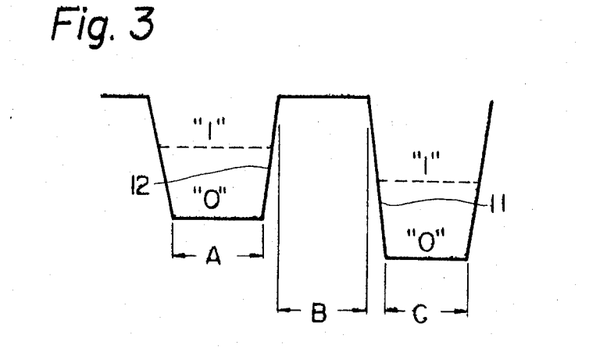
FIGS. 3 through 5 illustrate the minimum electron potential line in the bulk of the device, on the presumption that information "1" is storing electrons in the memory cell. Furthermore, the information "0" represents the non-existence of electrons in the memory cell.

In FIG. 3, a potential profile along line 30 (in FIG. 2) is illustrated in connection with regions A, B and C. The dotted and solid lines represent the existence and non-existence of electric charge, respectively. The electric potential of each of the regions A, B and C along line 30 is continuous with the potential of the neighboring region through P-N barriers 11 and 12.

The memory device according to the invention can be operated basically by the same method as illustrated with regard to the previously proposed memory device. Accordingly, the method of applying voltages is essentially the same as that of the previously described in the proposed memory device. The operation of the memory device according to the invention is hereinafter described with emphasis on the electric potential distribution in the substrate.

Write

Figure 4:
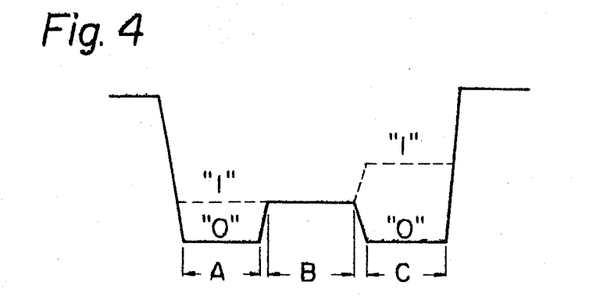
Figure 5:
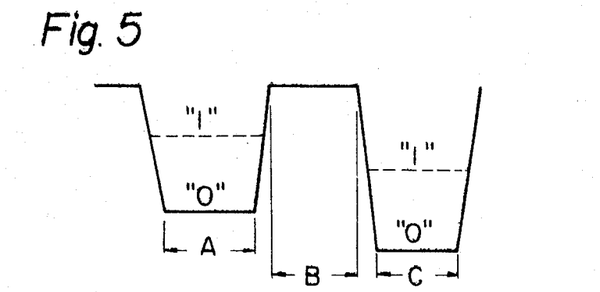

As a result of a set of the voltages being applied simultaneously, the electric potential distribution is formed in the memory cell region A, in the gate region B and in the source region C of the substrate, as shown in FIG. 4, in which the dotted and solid lines correspond, respectively, to the transferring and non-transferring modes. The WRITE is therefore performed according to the differences in the potential levels in each of the regions A, B and C. After the completion of WRITE, every voltage which had previously been a positive value drops to zero, with the result being that the electric potential distribution as shown in FIG. 5 is produced. Since the electric charge injected in the region A cannot advance beyond the potential barrier in the region B to enter further into the region C, and vice versa, the electric charge is maintained in the memory cell region A.

Figure 6:
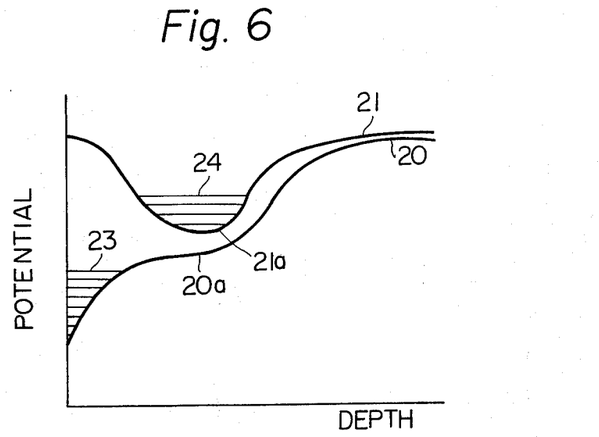
FIG. 6 illustrates electron potential distributions in the memory cell region in a perpendicular direction from the surface of the substrate.

At the instant when the electron potential, as shown in FIG. 4, is produced in the horizontal direction of the bulk of the substrate, the electron potential in the perpendicular direction varies within the underlying region of the memory cell electrode 6 (FIG. 2), as shown by a curve 20 in FIG. 6. As seen from this curve 20, the potential 20 increases with the increase in depth from the surface of the bulk of the substrate, and with a lesser gradient at the region 20a corresponding to the heavily doped buried layer 9 than at the neighbouring regions. In addition, at the instant when the potential as shown in FIG. 5 is produced in the horizontal direction of the bulk of the substrate, the potential in the perpendicular direction varies as shown by a curve 21 in FIG. 6. The electron potential is minimum at the region 21a corresponding to the location of the buried layer because no external electric fields are applied to the electrodes. The teachings from FIG. 6 enable one to determine the passage of the electric charge, which is believed to be as shown by line 22 in FIG. 7. Namely, when writing the information "1", the electric charge in the N+-type doped layer 8 passes during the period denoted as $t_1$, in which $\phi_M$ and $\phi_G$ are positive and $\phi_S$ is zero, under the gate electrode 4 and arrives at the region near the surface under the memory cell electrode 6. The passage of the electric charge is situated in the region near the surface as understood from the curve 20 of FIG. 6. The location of the electric charge can, therefore, be illustrated as numeral 23 in FIG. 6. When the electric potential is changed during the $t_2$ period, in which $\phi_M$ and $\phi_G$ are zero, from curve 20 to curve 21, the electric charge moves to the region of a minimum electron potential 21a (FIG. 6). The electric charge, therefore, moves from the surface of the substrate 1 below the electrode 6 into the N-type buried layer, so that the electric charge can be stored in the buried layer 9 of the memory cell region A. The stored electric charge in a well 24, FIG. 6, cannot overflow the well 24 formed by the P-N barriers.

Read

Figure 8:
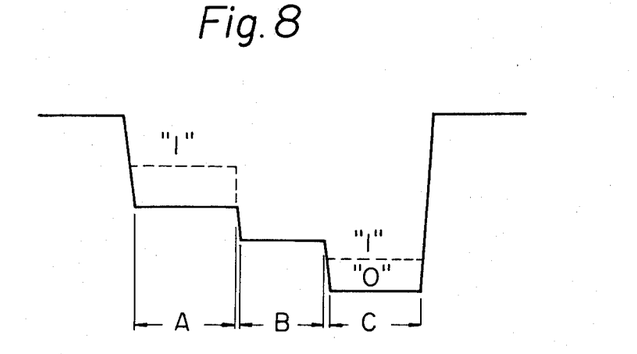
FIG. 8 is a drawing similar to one of the drawings, FIGS. 3 through 5.

As a result of the applied voltages, the electric potential is formed in each region of the substrate as shown in FIG. 8. When an electric charge representing the information "1" is injected into the doped region C, the electron potential in the region C is raised, while the information "0" does not change the potential in the region C.

Figure 9:
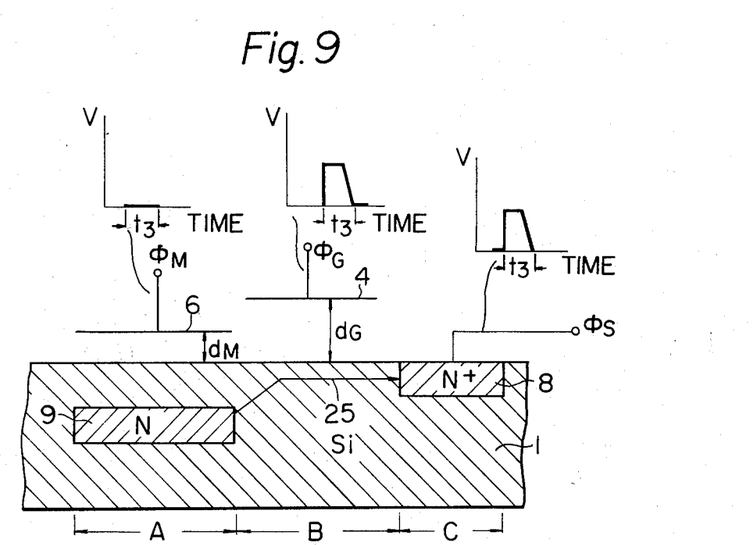
FIG. 9 is a drawing similar to FIG. 2 illustrating the passage of an electric charge being withdrawn from the buried layer.

The electric charge passes from the N-type buried layer 9 to the N+-type doped layer 8 along the passage depicted in FIG. 9 and numbered as 25. As is clear, the electric charge advances aslant during the period of $t_3$, in which $\phi_M$ and $\phi_S$ are zero and $\phi_G$ is positive, to an underlying region of the gate electrode 4 without passing in the region near the surface under the memory cell electrode 6, because the minimum electric potential in the regions A, B and C is situated in the N-type buried layer 9 and in the region near the surface of substrate 1.

Refresh

Because the information stored in the buried layer could be destroyed due to the movement of electric charge between the N-type buried layer and the P-type substrate, accordingly, the memory cell must be periodically refreshed. The refreshment is performed in the following three stages:

In the first stage, the pulse voltages $\phi_S$ and $\phi_G$ are maintained at positive values, while the pulse voltage $\phi_M$ drops to zero, and hence the potential distribution as illustrated in FIG. 8 is created. The electric charge in the memory cell can therefore be transferred through the gate region and into the doped layer. Positive holes found in the substrate and present around the memory cell region can be excluded from this region.

In the second stage, the pulse voltages $\phi_M$ and $\phi_G$ are maintained at positive values, while the pulse voltage $\phi_S$ drops to zero, and hence the created potential distribution, as illustrated in FIG. 4, includes different potential levels as represented by the dotted and solid lines corresponding to the information "1" and "0", respectively. This second stage corresponds to the preceding or first half stage of WRITE. The information "1" can be moved to the doped layer 8 (FIG. 8), while the information "0" does not bring about a change in the doped layer 8.

In the third stage, every pulse voltages $\phi_M$, $\phi_G$ and $\phi_S$ are zero, and hence the potential distribution as illustrated in FIG. 5 is created. This third stage corresponds to the second half stage of WRITE and enables the information, which has been moved to the doped layer 8 (FIG. 8), to be stored in the memory cell.

Accordingly, in the first stage, the positive holes are excluded from the memory cell region and the information stored in the memory cell is withdrawn therefrom. In the second and third stages, the previously stored electric charge is returned into the memory cell, and, furthermore, the electric charge previously not stored is not injected into the memory cell.

The invention is still further illustrated below by way of a specific example.

EXAMPLE

An embodiment of the semiconductor memory device as illustrated in FIG. 1 was produced by the following procedures.

Figure 10:
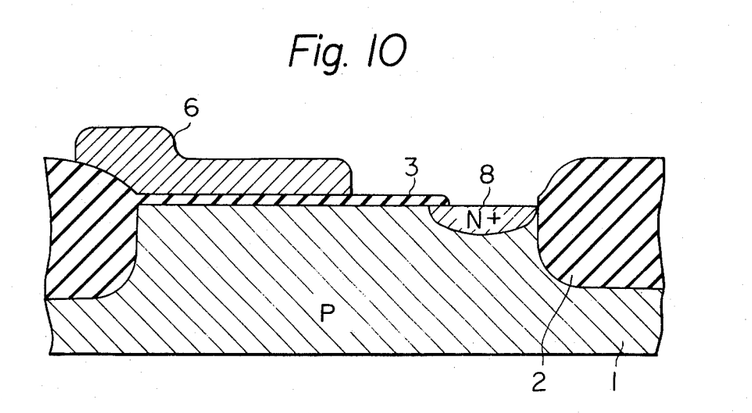
FIGS. 10 and 11 are drawings similar to FIG. 1 illustrating the intermediate steps for producing the device as illustrated in FIG. 1.
Figure 11:
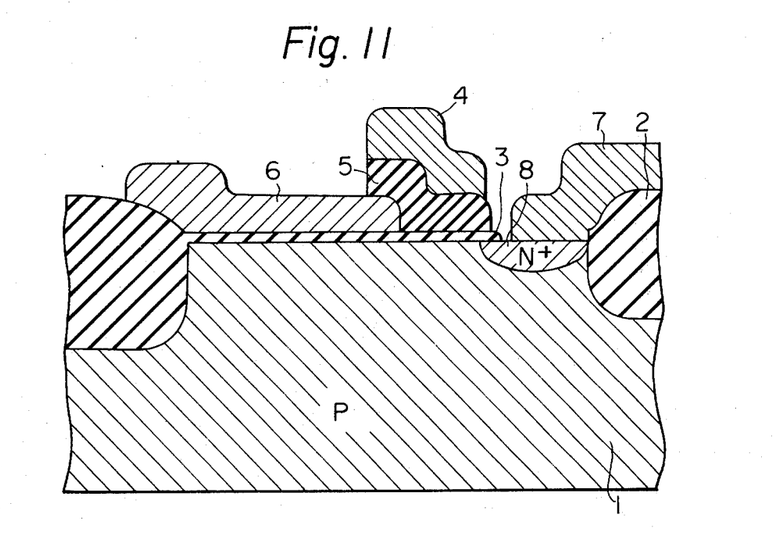

In FIG. 10, a P-type, semiconductor substrate 1 containing an impurity of boron at a concentration of $1 \times 10^{15}$ atoms per cubic centimeter and provided with a thick $SiO_2$ layer 2 was subjected to thermal oxidation at a temperature of about 1100° C to form a $SiO_2$ layer 3 having a thickness of approximately 1000 angstroms. A window 12 was formed by immersing the wafer into an etchant of HF and $NH_4F$ in order to remove a part of the $SiO_2$ layer 3. Then, the phosphorous was diffused into the exposed part of the substrate up to a concentration of $10^{21}$ atoms per cubic centimeter, thereby forming a N+-type doped layer 8. A polycrystalline silicon 4 was deposited by decomposition of silane on the entire top surface of the wafer up to a thickness of approximately 2000 angstroms and then was selectively removed by using a solution containing HF and $HNO_3$ to retain the polycrystalline silicon over the memory cell region. Subsequently, a glass layer containing phosphorous was deposited on the entire top surface of the wafer up to a thickness of approximately 3000 angstoms and then was selectively removed from the region of the N+-type doped layer 8. The doping of the phosphorous into the polycrystalline silicon layer 4 was performed by heating the wafer at a temperature of approximately 1050° C. A tungsten layer 6 was deposited up to a thickness of 5000 angstroms by using the well-known sputtering method on the entire top surface and then was selectively removed to retain the tungsten 6 over the gate region (not shown in FIG. 11). Chromium, molybdenum, and tungsten are preferable for use as materials for the gate electrode, because these metals, particularly tungsten, protect the underlying substrate from being introduced to an impurity by the ion-implantation method. The exposed part of the glass layer 5 was removed by an etchant of a solution containing HF and $HNO_3$, while the underlying part of the glass layer 5 below the tungsten layer 6 was protected from the etchant by the tungsten layer 6. Phosphorous, which is an impurity rendering the opposite conductivity type from that of the substrate, is ion-implanted from above the wafer at an energy of 400 KeV through the layers 3 and 4 into the bulk of the substrate 1, while the tungsten layer 6 protects a part of the bulk of the substrate below the layer 6 from the ion-implantation. As a result of the ion-implantation, the N-type buried layer (not shown in FIG. 11) could be created at 1500 angstroms below the surface of the substrate. Said buried layer exhibited $10^{17}$ atoms per cubic centimeter at the maximum.

Although not described in order to avoid unnecessarily complicating this description, the selective removing was performed by a well-known photolithographic technique.

Figure 7:
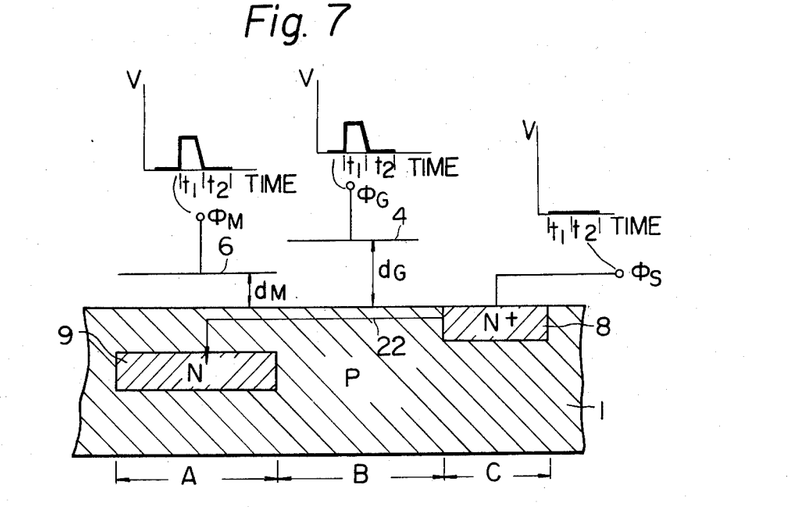
FIG. 7 is a drawing similar to FIG. 2 illustrating the passage of an electric charge being injected into the buried layer.
Figure 12:
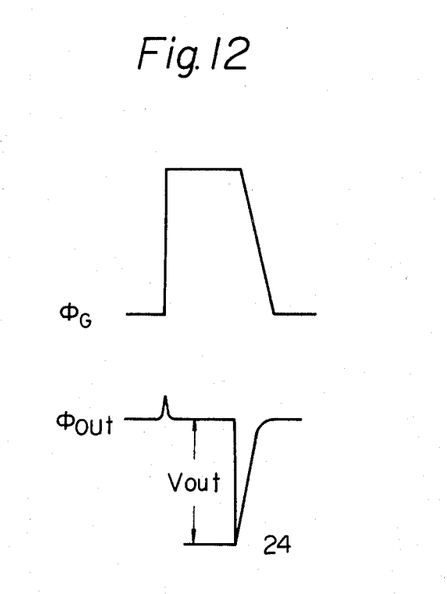
FIG. 12 illustrates patterns of the voltage being applied to the gate electrode and patterns of the output voltage.

The produced memory device was operated by applying voltages having a clock pulse pattern of information "1" as illustrated in FIG. 7 and a clock pulse pattern of READ as illustrated in FIG. 9. The duration of the clock pulses, $t_1$, $t_2$ and $t_3$, was 760 nanoseconds, respectively, and the amplitude was from 5 to 10 volts. The memory cell was refreshed at a period of every 200 milliseconds. The output voltage $\phi_{out}$ resulting from the reading of information "1" is illustrated in FIG. 12, in which the output voltage $\phi_{out}$ is shown in relation to the duration and magnitude of the voltage $\phi_G$. The magnitude $V_{out}$ of the output voltage $\phi_{out}$ was 20 mV.

Although only one particular arrangement of the insulating layers was illustrated in the Example, it is also possible, for example, to arrange the memory cell electrode on a part of an insulating layer which is placed on the substrate and provided with an aperture exposing one part of the doped layer, and to arrange the gate electrode separated from the memory cell electrode on a remaining part of the insulating layer.

What we claim is:

1. A semiconductor memory device, which comprises:
   a semiconductor material substrate having one particular conductivity type and comprising, on the surface thereof, a doped layer with an impurity of the opposite conductivity type, a first surface region of said substrate adjoining said doped layer used as a gate region, a second surface region of said substrate adjoining said first surface region used as a memory cell region, and further comprising in the interior thereof a buried layer of said opposite conductivity type situated below said memory cell region of said substrate;
   a doped layer electrode disposed on said substrate and electrically connected with said doped layer;
   a first insulating layer placed on said substrate and, with said doped layer electrode, incompletely covering said doped layer so as to form an aperture exposing a part of said doped layer;
   a gate electrode placed over said gate region and electrically insulated from said gate region by at least said first insulating layer; and
   a memory cell electrode placed over said memory cell region and electrically insulated from said memory cell region by at least said first insulating layer; wherein an electric charge of said opposite conductivity type is either injected from said doped layer through said gate region into said buried layer to be stored in this layer or withdrawn from said buried layer through said gate region to said doped layer, depending upon the electric potential levels in said substrate, which levels are established by electric fields created by each of said electrodes through said insulating layers.

2. A semiconductor memory device according to claim 1, wherein said impurity of the opposite conductivity type is more heavily doped in said doped layer than in said buried layer.

3. A semiconductor memory device according to claim 1, wherein said injection into the buried layer is performed in such a manner that the electric charge in said doped layer moves through a region near the surface of said substrate in a horizontal direction until said charge is under said memory cell electrode, and said charge then moves vertically into said buried layer; furthermore, said withdrawal is performed in such a manner that said stored electric charge moves from said buried layer to an underlying region of said gate electrode and said charge then moves through the region near the surface of said substrate in a horizontal direction.

4. A semiconductor memory device according to claim 1, wherein said first insulating layer, which electrically insulates said memory cell electrode, includes a first part which forms said aperture exposing one part of said doped layer, said memory cell electrode being placed on said first part, and includes a second remaining part of said insulating layer which electrically insulates said gate electrode.

5. A semiconductor memory device according to claim 4, wherein said injection into the buried layer is performed in such a manner that the electric charge in said doped layer moves through a region near the surface of said substrate in a horizontal direction until said charge is under said memory cell electrode, and said charge then moves vertically into said buried layer; furthermore, said withdrawal is performed in such a manner that said stored electric charge moves from said buried layer to an underlying region of said gate electrode and said charge then moves through the region near the surface of said substrate in a horizontal direction.

6. A semiconductor memory device according to claim 4, wherein there is provided a second insulation layer which is substantially placed on both the entire second part of the first insulating layer and a surface of a part of said memory cell electrode adjacent to said second part of said first insulating layer.

7. A semiconductor memory device according to claim 6, wherein said memory cell electrode consists of doped polycrystalline silicon; said gate electrode consists of one member selected from the group consisting of aluminum, chromium, molybdenum, tungsten and doped polycrystalline silicon; and said first insulating layer consists of SiO$_2$ and a glass layer containing an impurity of said opposite conductivity type.

8. A semiconductor memory device according to claim 7, wherein said gate electrode consists of tungsten.

9. A semiconductor memory device according to claim 8, wherein said injection into the buried layer is performed in such a manner that the electric charge in said doped layer moves through a region near the surface of said substrate in a horizontal direction until, said charge is under said memory cell electrode, and said charge then moves vertically into said buried layer; furthermore, said withdrawal is performed in such a manner that said stored electric charge moves from said buried layer to an underlying region of said gate electrode and said charge then moves through the region near the surface of said substrate in a horizontal direction.

10. In a semiconductor memory device which includes:
a semiconductor material substrate having one particular conductivity type and comprising, on a given surface thereof, a doped layer with an impurity of conductivity type opposite to said one particular conductivity type, and further comprising a first surface region adjoining said doped layer and defining a gate region, and a second surface region adjoining said first surface region remote from said doped layer and defining a memory cell region;
a insulating layer disposed on said substrate over said gate region and said memory cell region, and incompletely covering said doped layer so as to form an aperture exposing a portion of said doped layer;
a gate electrode disposed on said insulating layer, and overlying said gate region; and
a memory cell electrode disposed on said insulating layer, and overlying said memory cell region;
the improvement comprising the inclusion, within the interior of said substrate in said memory cell region, of a buried layer of said conductivity type opposite to said one particular conductivity type.

11. In the device of claim 10 wherein said impurity of the opposite conductivity type is more heavily doped in said doped layer than in said buried layer.

12. In the device of claim 10 wherein said insulating layer has a memory cell portion between said substrate and said memory cell electrode, and a gate portion between said substrate and said gate electrode, said device including an additional insulating layer disposed in part on a surface of said gate portion and in part on a surface of said memory cell electrode.

13. In the device of claim 12 wherein said additional insulating layer is glass.

14. In the device of claim 10 wherein said memory cell electrode is doped polycrystalline silicon.

15. In the device of claim 10 wherein said gate electrode is selected from the group consisting of aluminum, chromium, molybdenum tungsten and doped polycrystalline silicon.

16. In the device of claim 10 wherein said insulating layer is SiO$_2$.

17. In the device of claim 10 wherein said gate electrode is tungsten.

18. In the device of claim 10 including a lead electrode disposed on and incompletely covering said doped layer.

19. In the device of claim 18 including voltage means connected to said memory cell electrode, gate electrode and lead electrode, respectively, for applying a first set of respective voltage pulses thereto during a first time period, whereby an electric charge in said doped layer moves through a region near the surface of said substrate in a horizontal direction until said charge is under said memory cell electrode, and for applying a second set of respective voltage pulses thereto during a second time period, whereby said charge then moves vertically into said buried layer.

20. In the device of claim 18 including voltage means connected to said memory cell electrode, gate electrode and lead electrode, respectively, for applying a set of respective voltage pulses thereto, whereby an electric charge previously stored in said buried layer moves from said buried layer to an underlying region of said gate electrode and said charge then moves through the region near the surface of said substrate in a horizontal direction.

21. A method of storing information in a semiconductor memory device, comprising the steps of:
a. providing a semiconductor material substrate of given conductivity type and having, on a given surface thereof, a doped layer with a lead electrode disposed thereon and connected thereto, and having, disposed above said given surface, a gate electrode adjacent to said doped layer, and a memory cell electrode adjacent to said gate electrode, and having, within the interior of said substrate below said memory cell electrode, a buried layer of conductivity opposite to said given conductivity;

b. applying a first set of respective voltage pulses to said memory cell electrode, said gate electrode and said lead electrode, respectively, during a first time period so as to cause the electric charge in said doped layer to move through a region near the surface of said substrate in a horizontal direction until said charge is under said memory cell electrode; and c. applying a second set of respective voltage pulses to said memory cell electrode, said gate electrode and said lead electrode, respectively, during a second time period so as to cause said charge to move vertically into said buried layer.

22. A method of reading information from a semiconductor memory device, comprising the steps of:

a. providing a semiconductor material substrate of given conductivity type and having, on a given surface thereof, a doped layer with a lead electrode disposed thereon and connected thereto, and having, disposed above said given surface, a gate electrode adjacent to said doped layer, and a memory cell electrode adjacent to said gate electrode, and having, within the interior of said substrate below said memory cell electrode, a buried layer of conductivity opposite to said given conductivity; and b. applying a set of respective voltage pulses, to said memory cell electrode, gate electrode, and lead electrode, respectively, so as to cause an electric charge previously stored in said buried layer to move from said buried layer to an underlying region of said gate electrode and then to move through a region near the surface of said substrate in a horizontal direction.

* * * * *

UNITED STATES PATENT AND TRADEMARK OFFICE
CERTIFICATE OF CORRECTION

PATENT NO. : 4,062,037

DATED : December 6, 1977

INVENTOR(S) : Ryoiku Togei et al

It is certified that error appears in the above-identified patent and that said Letters Patent are hereby corrected as shown below:

```
Column 3, line 40, "fields" should be --field--.
Column 4, line 45, "no" should be --not--.
Column 4, line 50, "tope" should be --top--.
Column 5, line 4, "electric minimum" should be --minimum
    electric--.*
Column 10, line 28, insert --,-- after --molybdenum--.
```

Signed and Sealed this

Twenty-fifth Day of April 1978

[SEAL]

Attest:

RUTH C. MASON
Attesting Officer

LUTRELLE F. PARKER
Acting Commissioner of Patents and Trademarks